United States Patent [19]

Stebbins et al.

[11] Patent Number: 5,418,794
[45] Date of Patent: May 23, 1995

[54] ERROR DETERMINATION SCAN TREE APPARATUS AND METHOD

[75] Inventors: Robert G. Stebbins; Quang H. Nguyen, both of San Jose, Calif.

[73] Assignee: Amdahl Corporation, Sunnyvale, Calif.

[21] Appl. No.: 993,137

[22] Filed: Dec. 18, 1992

[51] Int. Cl.⁶ .............................................. G06F 11/00
[52] U.S. Cl. ................................. 371/29.1; 371/16.5; 371/12
[58] Field of Search ................ 371/22.1, 29.1, 12, 371/22.2, 22.3, 22.4, 22.5, 22.6, 15.1, 16.5; 324/158 R

[56] References Cited

U.S. PATENT DOCUMENTS

| 4,464,751 | 8/1984 | Stranko et al. | 371/29.1 X |
| 4,593,391 | 6/1986 | Mizushima et al. | 371/29.1 X |
| 4,679,195 | 7/1987 | Dewey | 371/29.1 |
| 4,727,545 | 2/1988 | Glackemeyer et al. | 371/29.1 X |
| 4,932,028 | 6/1990 | Katircioglu et al. | 371/29.1 X |
| 5,056,091 | 10/1991 | Hunt | 371/12 X |
| 5,081,626 | 1/1992 | Scott | 371/22.1 X |
| 5,195,095 | 3/1993 | Shah | 371/22.1 X |

Primary Examiner—Emanuel T. Voeltz
Assistant Examiner—Eric W. Stamber
Attorney, Agent, or Firm—Fliesler, Dubb, Meyer & Lovejoy

[57] ABSTRACT

An error detection scan tree apparatus and method including a plurality of error detection devices in which an error signal generated by an error detection device is propagated from the detection device through the scan tree of minimalistic structure to an error servicing unit. A plurality of scan out points are provided at specific locations within the scan tree that are capable of non-disruptively latching an error signal propagating therethrough so as to facilitate a more efficient scan out of the state of the system upon the occurrence of an error.

4 Claims, 4 Drawing Sheets

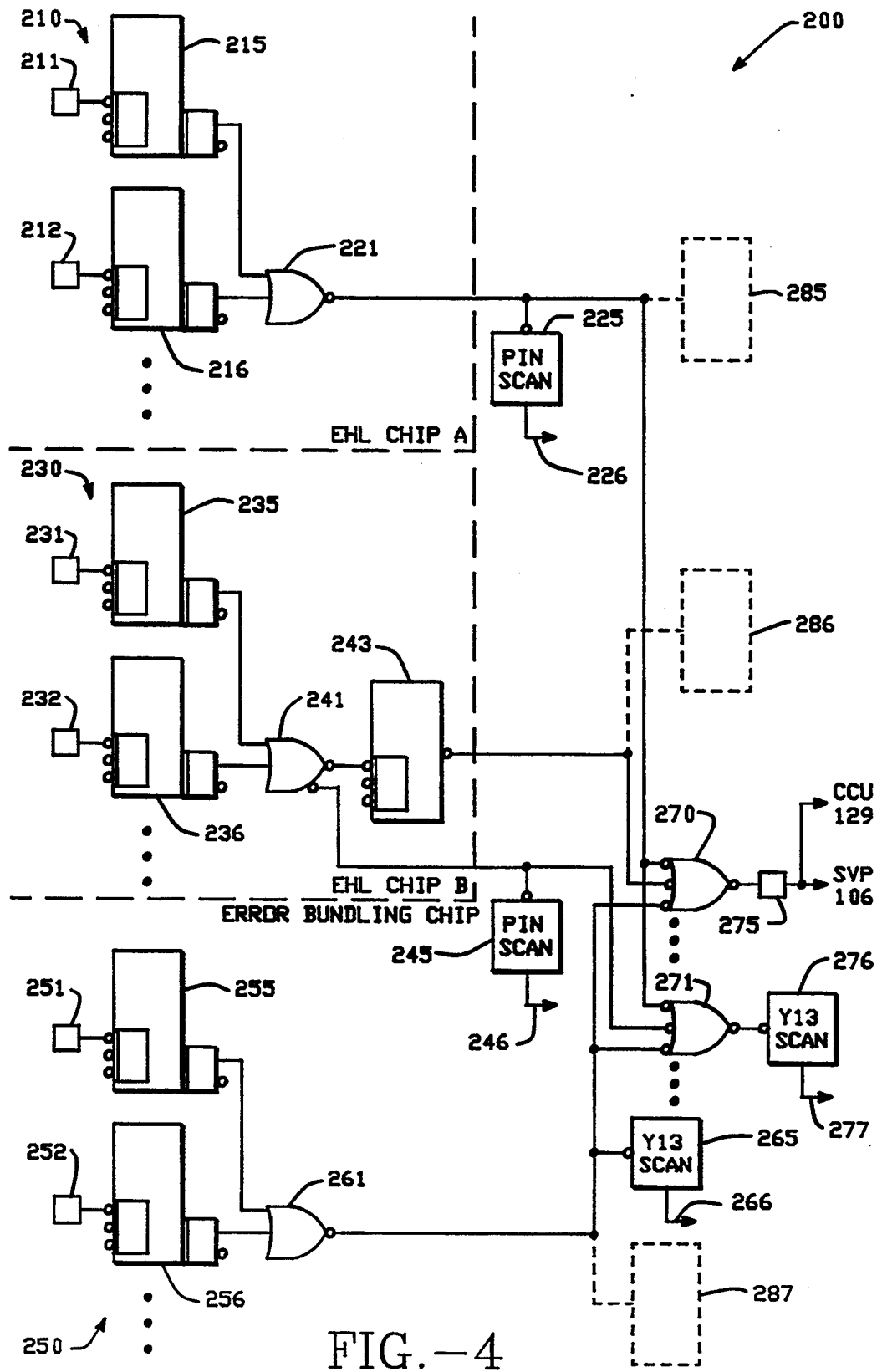
FIG.—4

ERROR DETERMINATION SCAN TREE APPARATUS AND METHOD

BACKGROUND OF THE INVENTION

1. Technical Field

The present invention relates to large scale data processing systems and, more specifically, to error servicing circuitry and control logic in a data processing machine.

2. Description of Related Art

Large scale data processing systems, which include high speed digital computers, are comprised of a plurality of units such as a central processing unit (CPU), CPU storage unit, system control unit and main storage unit. These units may be physically located on one or several printed circuit boards, and each printed circuit board contains a plurality of integrated circuits. Each integrated circuit, contains from hundreds to hundreds of thousands of gates, where "gates" is defined as a collection of transistors which perform a logic function.

Approximately one third of the hardware which comprises the data processing system is dedicated to error detection and correction. This circuitry, which is transparent to a user, includes error detection devices and error latches to facilitate location of an error and error recovery hardware and software which perform error analysis and correction, where possible. A significant portion of the error servicing circuitry operates when the system clock are disabled.

When an error is detected, the error is latched and a signal from the latch is sent to a clock control unit (CCU) and the error servicing unit (ESU), prompting the clock control unit to disable system clocks. The stopping of the system clock freezes operation of the data processing system and permits a recovery algorithm to be implemented by the error servicing unit to process and correct, where possible, the detected error(s). Conventional data processing systems may operate at system clock speeds of 100 MHz or greater. As a result, when an error occurs, it may propagate throughout the system causing wide spread corruption of data before the system clock is disabled. Therefore, a great emphasis is placed on disabling the system clock as rapidly as possible in response to the detection of an error.

Referring to FIG. 1, a timeline is shown illustrating critical time periods involved in the detection of an error, the processing of that error, and the maximum permissible time period for the system clock to be disabled. The timeline 15 represents a chronological progression in time from left to right. At the moment 10, an error is detected and a generated error signal is sent to the error servicing unit. The period after the detection of a fault, but prior to disabling the system clock is designated as period A and is significant because during this period the system clock continues to run and erroneous data continues to be processed. It is important that period A be as short as possible to minimize fault propagation in the data processing system.

At moment 11, the error servicing unit disables the system clock and the system clock off period, designated by letter C, begins. In conventional data processing systems, this period can be no greater than a critical period of approximately 1 second. This is because the CPU of the data processing system is in communication with input/output facilities which require responses within specific time periods not exceeding the critical period. During the period C, an error servicing algorithm interrogates the error latches to determine location of an error and begins error processing to recover incorrectly processed data and to restore the data processing system to an error free state. The period B represents the time period required by the error servicing unit to detect the initial location of an error. Period D represents the period of time required by the error servicing algorithm to recover data and restore the system to a proper state. It is very important that period B be as short as possible because rapid determination of the location of an error provides the error servicing algorithm more time within period C to recover and restore data. A reduction in period B reduces the overall period C, thus minimizing the probability that the critical period will be exceeded. How the prior art has addressed these problems will now be discussed.

Referring to FIG. 2, a schematic view of a portion of a data processing system is shown, illustrating both a network of error detection devices and error latches, and a plurality of interconnected functional gates. The two primary purposes of FIG. 2 are to illustrate (1) the hierarchical structure of the error detection and latching network and (2) the speed at which one erroneous data bit may spread throughout the system corrupting data at those locations to which it propagates. Discussing the hierarchical structure of the error latching network first, block 51 will be used for purposes of illustration, to represent a memory device from which is output a signal onto line 91. Block 61 represents a parity checker. Note that a parity checker is used merely for purposes of this example, and that there are several other types of detection devices which could be substituted therefor. If the output of memory device 51 contains a parity error, then the parity checker 61 will detect this error and generate an error signal which is latched by error history latch 71. The output of error history latch 71 is connected to the input of a second stage error history latch 74 that also receives inputs from several other first stage error history latches, including error history latches 77 and 78. The output of the second stage history latch 74 is, in turn, input to a third stage error history latch 81 to which error history latches 75 and 76 are input. The output of the third stage error history latch 81 is connected to a fourth stage error history latch 82 (extended to the chip 90) which is further connected to a fifth stage error history latch 83 as shown. Each of the error history latches 71-78 and 81-83 are clocked by a system clock signal. This hierarchy is continued to a final latch register (not shown) for transmitting an error signal directly to the ESU. To better understand the hierarchical structure, a general overview is now presented.

The error detection and latching network, illustrated in part in FIG. 2, operates in a vast plurality of blocks. At the lowest level, a plurality of error history latches are bundled together to form an EHL group. A chip may contain several EHL groups and at a second lowest level, all the EHL groups for a particular chip are bundled together. At a third level, a plurality of chips are bundled together to form a section and at a fourth level, the plurality of sections for a particular unit are bundled together to form the error signal line for that unit. At a highest level, all of the error signal lines for a plurality of units on a unitary circuit board are bundled together to form a board level error signal which is propagated to the ESU and the CCU.

Applying this to the example of FIG. 2, an error detected by parity checker 61 will be gated through a series of error history latches on the chip 90 within which it resides, and further through a plurality of error history latches at the section, unit and board levels. In a conventional data processing system, this may entail, on average, a path of approximately 6–7 latches, thus necessitating 6–7 clock cycles before the CCU receives a generated error signal, a disadvantageously long delay. Upon reaching the clock control unit, several clock cycles are further required to "early-up" the system clock to determine an appropriate time to stop all the system clocks propagating in the system.

During this period (period A), between the detection of an error and disabling the system clock, erroneous data is being processed by the machine. To illustrate propagation of the error and the detection of this error by subsequent error detection devices, we will assume that the output of memory 51 is connected to a recursive adder 52 and off chip to a functional gate 54 located on chip 92. One clock cycle after the erroneous data was detected by the parity checker 61, it will be detected by parity checker 64. Detection of this error will cause the parity checker 64 to generate an error signal which is propagated to error history latch 72 and, in turn propagated to second stage error history latch 75. The output of second stage error history latch 75 is input to error history latch 81 and propagates as explained above with reference to error history latch 74. Since the adder 52 is recursive, as are those used in random number generating and digital signal processing circuits, the output of the adder 52 is feedback as an input. Therefore, the error first detected by parity checker 61 will be continually output from the adder 52.

Continuing with our example, the output of adder 52 is connected to a multiplier 53. Two clock cycles after the error was detected by parity checker 61, it is detected by parity checker 66. Parity checker 66 generates an error signal in response thereto which is propagated to error history latch 73. On the next error clock pulse, the error history latch 73 propagates this error signal to second stages error history latch 76 from which it is propagated to history latches 81–83 as described above. Thus, not only will an error propagate to subsequent functional gates and corrupt the data process therein, an error signal may be generated at each subsequent gate. Referring to chip 92, the function gate 54 receives data output on line 91. Therefore, the error detected by parity checker 61 will propagate to gate 54. This error will, in turn, propagate to gates 56 and 57, and then again off chip 92 to gate 58. In the small isolated portion of the system shown in FIG. 2, the error has propagated within three clock cycles to six gates, 52–58, corrupting data therein. The longer it takes for the error servicing unit to receive an error signal and generate a clocks off signal, the further erroneous data will propagate. The further erroneous data propagates, the longer the amount of time required during period D for the error recovery algorithm to recover the appropriate machine state. Thus, it is critical that period A be as short as possible.

A second undesirable feature of the prior art is the relatively long process that determines which data location caused the generation of an error signal (period B). Once the error servicing unit has successfully turned off the system clock, a determination is made of the first location which generated an error signal. This is done by a technique known as scan out, which is well known in the art. In conventional data processing system scan out procedures, each of the error history latches is polled to determine if an error signal is present. The polling process begins at a predetermined location and polls sequentially until all of the error history latches have been scanned. Since a conventional large scale data processing system may contain approximately 10,000 error history latches, the error servicing unit must necessarily poll 10,000 locations each time an error signal is detected. This requires a significant amount of time and disadvantageously extends the period B. Furthermore, an extension of period B detracts from the amount of time available in period D for the recovery algorithm to recover data and restore the system to a correctly functioning state.

SUMMARY OF THE INVENTION

Accordingly, it is an object of the present invention to provide an error determination scan tree for use in a data processing system in which a generated error signal is propagated from a detection device through the scan tree to a clock control unit in a more rapid manner.

It is another object of the present invention to provide at specific locations within such an error determination scan tree a plurality of scan out points that are capable of non-disruptively latching an error signal propagating within the scan tree so as to facilitate a more efficient scan out of the error state of the system.

These and related objects are achieved through use of the error determination scan tree apparatus and method herein disclosed. An error determination scan tree apparatus and method in accordance with the present invention includes an error signal propagation and error determination scan tree which combines error signals from a plurality of locations in a tree of minimalistic structure. A generated error signal is propagated through a significantly reduced number of hierarchical levels to appreciably increase the speed at which a generated error signal is propagated to a clock control unit and cause the system clocks to be disabled.

The present invention also places a plurality of scannable latches at strategic points throughout the tree. These locations are scanned, after the system clock has been disabled, and indicate through which branches of the tree an error signal has propagated. In this manner, a more efficient and rapid error analysis may be had.

BRIEF DESCRIPTION OF THE DRAWINGS

The invention will be better understood by reference to the figures of the drawings wherein like numbers denote like parts throughout.

FIG. 4 is a schematic/block diagram of an error determination scan tree.

DETAILED DESCRIPTION

The present invention may be practiced in a plurality of environments but is particularly well suited for implementation in a large scale data processing system. For that reason, such a large scale data processing system will be described first to provide a context for an environment in which the present invention may be practiced. A detailed description of the present invention in such a data processing system is provided thereafter.

Figure 1:
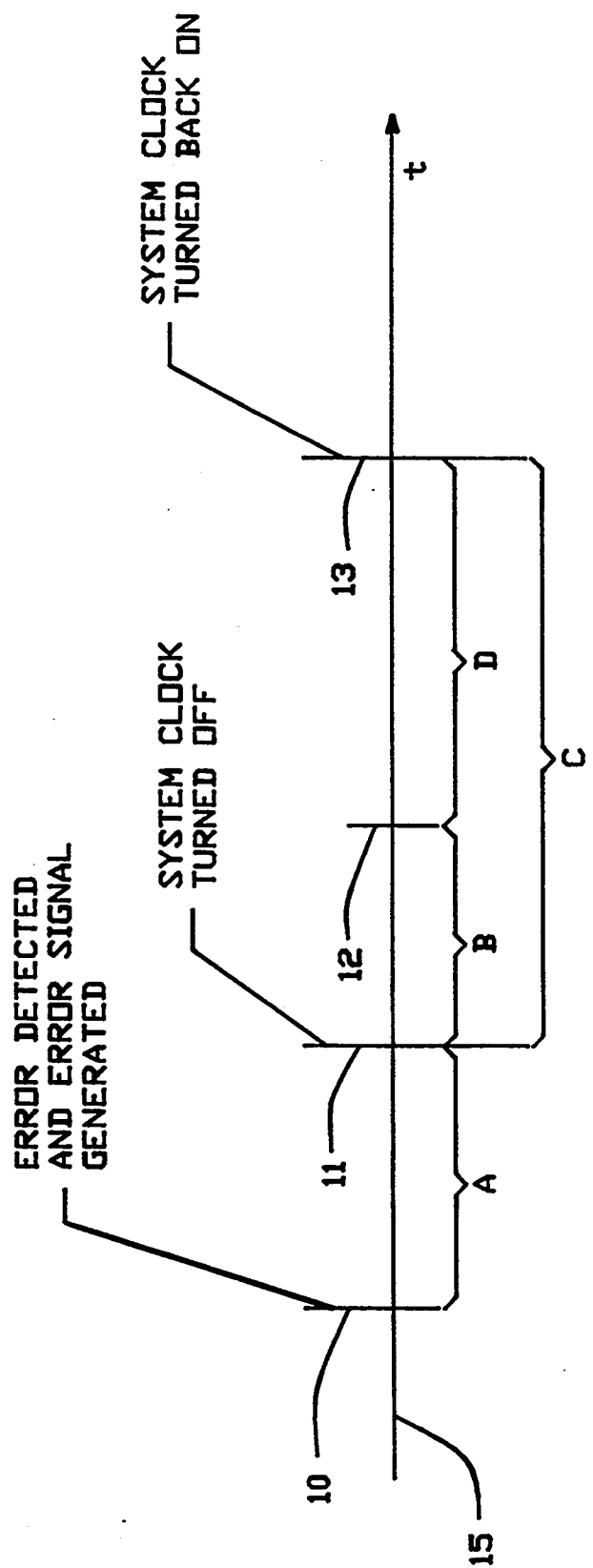
FIG. 1 is a timeline illustrating moments in time for the error detection and error recovery operations of a data processing system.
Figure 2:
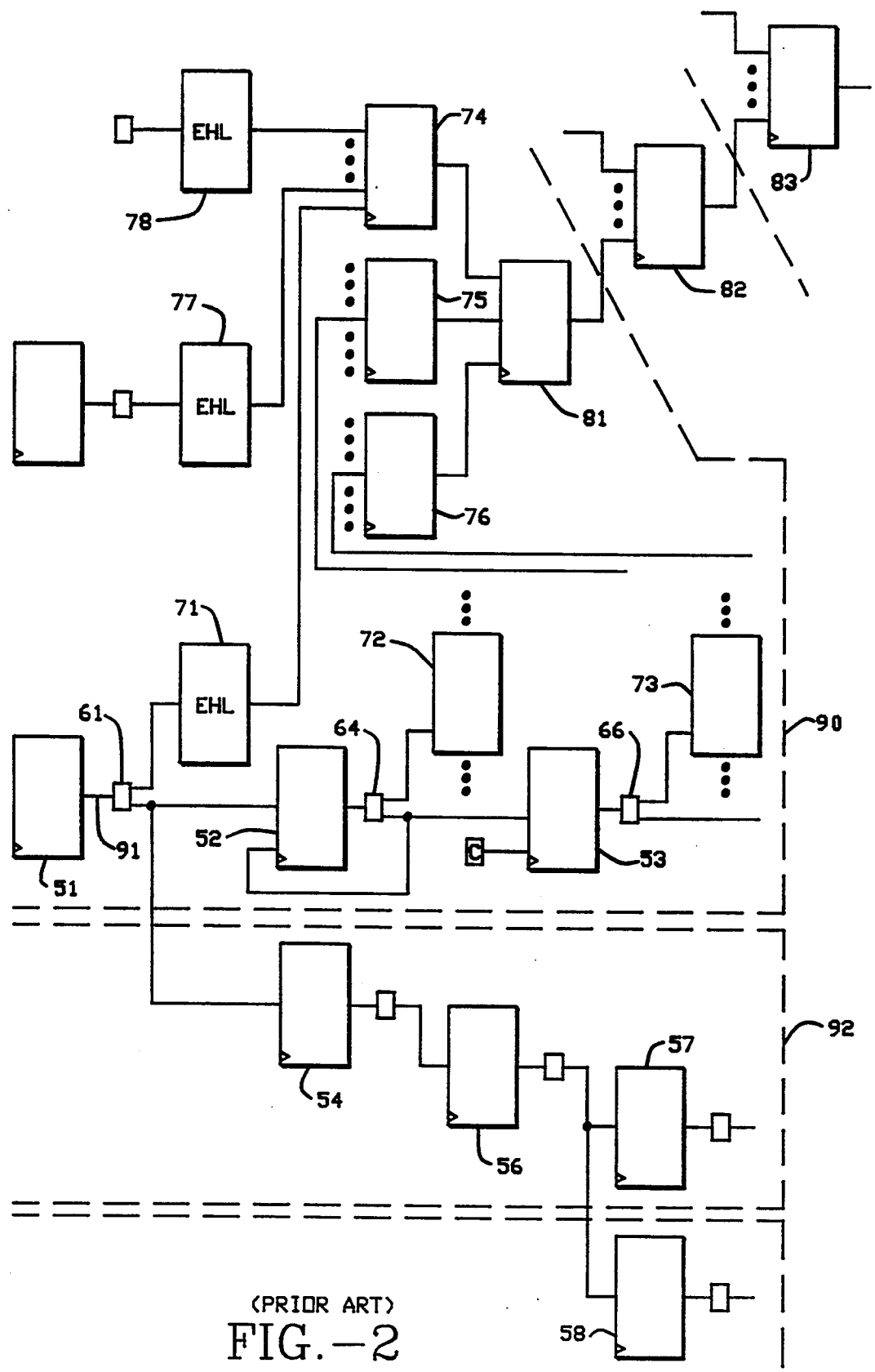
FIG. 2 is a schematic view illustrating the hierarchical error history latch structure of the prior art and the conceptual interconnection of functional gates in a conventional data processing system.
Figure 3:
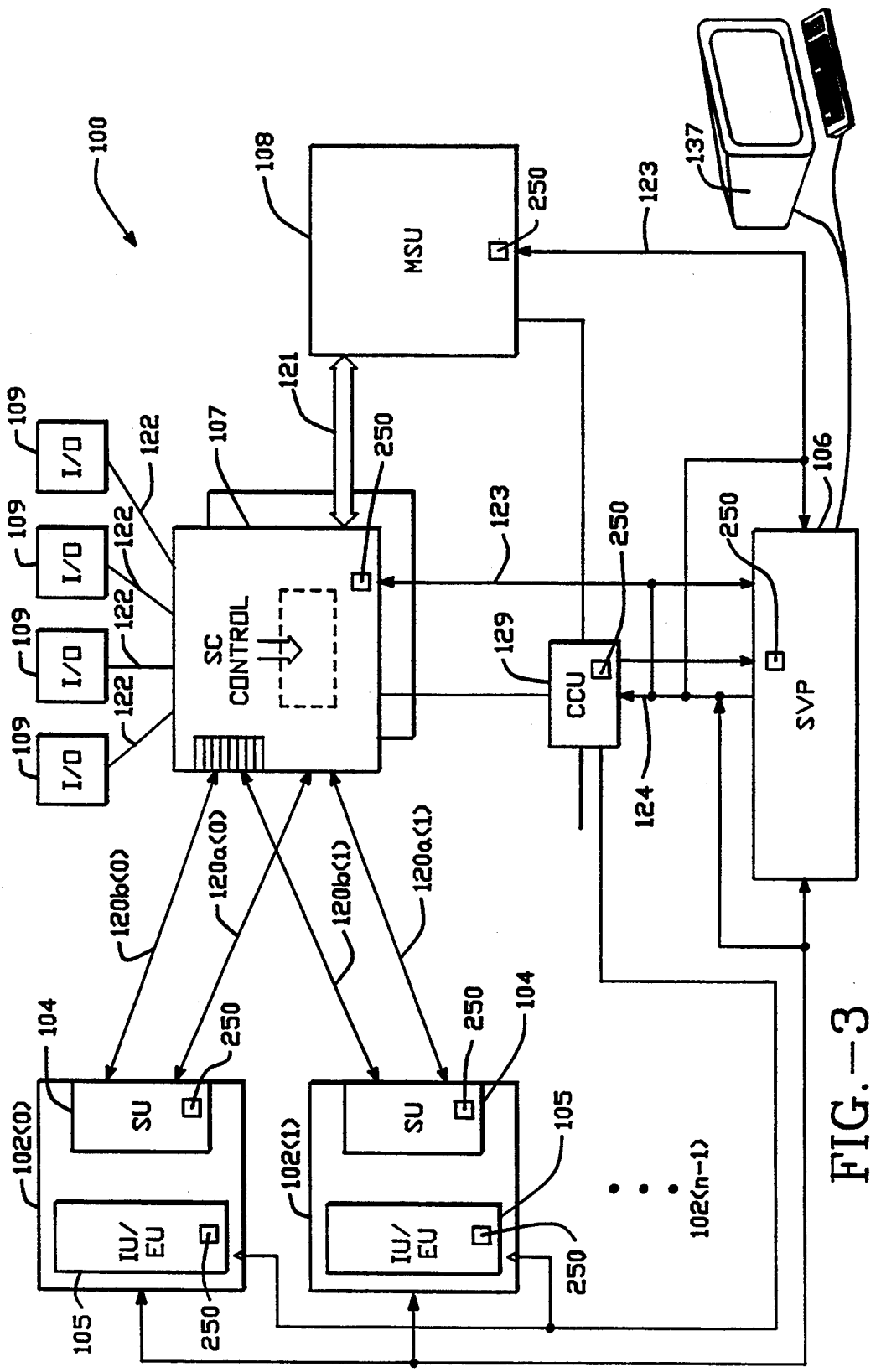
FIG. 3 is a block diagram of a data processing system.

Referring to FIG. 3, a multi-CPU computer system 100 is illustrated. The computer system 100 includes a plurality of central processing units 102 (0) to 102 (n−1), each having a storage unit 104 with a cache and an instruction unit 105. Each of the CPUs is coupled to a system control unit 107 across data lines 120a and control lines 120b. The data lines 120a (0) to 120a (n−1) transmit data to and from the system control unit 107 and the storage unit of each CPU 102. The control lines 120b transmit address, opcodes and controls between these two entities 107 and 102.

The system control unit 107 also includes an interface 121 to a main store unit 108. The system control unit 107 controls access to data among the CPUs and the main storage unit 108. Also coupled to the system control unit 107 through interface 122 are the input/output units 109. A service processor 106 is coupled to all of the functional units of the computer system 100 by scan interface 123, or otherwise as known in the art. The scan interface 123 provides access to data locations in the CPUs 102, main store unit 108 and system control unit 107 through a path independent of the normal operational path of the CPUs or system control units themselves. Thus, the service processor 106 is able to scan data indicating the state of the computer system out of the computer system without affecting the normal control path. Also, the service processor is able to write data into specific data locations within the functional units of the system using a scan-in technique described below.

Each of the functional units of the system 100 contains error detection devices (shown below) which are arranged throughout each unit and may be present in quantities of approximately 1,000 or more. An error detected by one of these devices is bundled within its unit (as discussed below) and propagated over interface 123 to the service processor 106 and to the system clock control unit (CCU) 129. The clock control unit 129 is shown isolated from other units, but may be located on one of the functional units such as the system control unit 107. In response to the reception of an error signal, the CCU 129 generates a system clock disable signal to disable the system clock and the service processor 106 invokes a recovery algorithm. After processing the error, which includes logging error information and recovering a proper machine state, the service processor 106 sends a signal to the CCU 129 for restarting the system clock.

Each of the units contains an error bundling chip 250. The error bundling chip 250 of each unit bundles the output signals from each of the error history latches (shown below) for that unit. The bundled error signal from each of these chips is propagated to the CCU 129 and the service processor 106 as discussed above.

Referring to FIG. 4, a schematic diagram representative of an error determination scan tree is shown. A similar error determination scan tree is found in each of the functional units, though the function provided by some units may call for a modification of this structure. Such modifications are considered to be within the scope of the invention. For purposes of clarity and to avoid redundancy, an error determination scan tree for one unit is now presented. An error signal from this unit error determination scan tree 200 is propagated over line 280 to the service processor 106 and CCU 129 as are the output error signals from the error determination scan trees (not shown) of the other units.

Within the error determination scan tree 200, there are essentially 3 types of error handling chips and there may be one or more of each type of these chips. For purposes of describing the present invention, these will be indicated as non-staging chip 210, staging chip 230 and bundling chip 250. A unit will often contain more than one of the non-staging 210 and staging 230 chips. For purposes of illustration, only one of each types of these chips is shown.

The general arrangement of these chips within a unit is as follows. Throughout a unit, a large plurality of error detection devices are implemented. Each of these detection devices, here represented by detection devices 211-212, 231-232, is provided for error checking of functional logic. In the case of the non-staging and staging chips 210, 230, the error detection devices are located external to the chip and the chips themselves consist essentially of a plurality of error history latches, a logical bundling element and in the case of the staging chip 230, a staging latch. Scanpoint mechanisms (discussed below) are also provided. The 3 types of chips 210, 230, 250 are now presented in more detail.

Referring to the representative non-staging chip 210, this chip contains a plurality of error history latches (EHLs) of which error history latch 215 and 216 are shown. Error detection devices 211, 212 are connected to EHLs 215, 216, respectively, and may include a parity checker, or the like. Error detection devices are known in the art. Upon detection of an error at one of the error detection devices 211, 212, an error signal is generated and latched by the respective EHL 215, 216.

The outputs of each of the error history latches 215, 216 in EHL chip (or "group") 210 are bundled at NOR-gate 221. Suitable logical bundling mechanisms are known in the art, such as an OR-gate. The output of the NOR-gate 221 is connected to a scanpoint 225 and to an input of unit error signal NOR-gate 270 and unit scanpoint NOR-gate 271. When an error signal is output from NOR-gate 221, it is propagated to a scanpoint 225, which is essentially a sampling gate of a large multiplexer (not shown) and to NOR-gates 270 and 271. A signal at the scanpoint is propagated through the multiplexer to a scan machine, not shown but of a type known in the art, where it is latched and transmitted to the service processor 106.

At the NOR-gate 270, the error signal is propagated through to the unit error latch 275, where it is latched. The latch 275 is provided because the error reported to the clock control unit needs to be synchronous to make the machine operations deterministic.

The output of the unit error latch 275 is connected to the CCU 129 and the service processor 106 and thus, upon the latching of the error signal by latch 275, it is delivered to the CCU 129 and the service processor 106 which disables the system clock and invokes a recovery algorithm, respectively, in response thereto.

At NOR-gate 271, the error signal is propagated through to unit scanpoint 276, which is configured in a manner similar to that of scanpoint 225, though it represents an error for the unit represented in FIG. 3 and not merely an EHL group.

Referring to the staging chip 230, this chip 230 has some of the same hardware as the non-staging chip 210 and also provides a staging latch 243. Similar in structure to chip 210, the staging chip 230 has a plurality of EHLs 235 and 236. Each of these EHLs 235 and 236, receives as an input, the output of an error detection device 231 and 232, respectively. The output of all of the EHLs (235,236, etc.) for the staging chip 230 are bundled at NOR-gate 241. The output of NOR-gate 241 is bifurcated and propagated along one path to the staging latch 243 and along a second path to chip scanpoint 245 and unit scanpoint 276.

The staging latch 243 provides synchronous error reporting to the clock control unit 129 as required to make machine operations deterministic. One of the requirements to bring up a machine is that the machine behave the same regardless of cycle time and/or single cycling of the clocks. The requirement is needed to be able to recreate problems deterministically several times. In other words, once an error has occurred, the clocks must go off after the same number of clock cycles regardless of cycle time. A staging latch is needed to avoid a long path from an EHL (235, 236, etc.) to the unit reporting latch, in this case latch 275.

Referring now to the error bundling chip 250, this chip contains a plurality of EHLs 255 and 256, to which are input error detection devices 251 and 252, respectively. The error detection devices 251 and 252 are internal to the error bundling chip 250 and are provided for error checking in the functional logic of the error bundling chip 250. The outputs of EHLs 255, 256 are bundled at NOR-gate 261 in a manner similar to the bundling performed by NOR-gates 221 and 241. An error signal output from NOR-gate 261 is propagated to an error bundling chip scanpoint 265, to the unit scanpoint 276 and to unit error signal NOR-gate 270, where it is passed through to the unit error latch 275.

Thus, one feature of the error determination scan tree 200 is that error signals generated by any of the plurality or detection devices 211–215, 231–232, 251–252 are propagated in an efficient manner in which the tree hierarchy contains merely a first level where error signals are bundled at the chip level (or in EHL groups) and a second level or unit level where errors from each of the chip level bundling devices are bundled and sent to the service processor and CCU.

Another feature of the present invention is the utilization of scanpoints 225, 245, 265, 276 to aid in an efficient scan-out of machine state. Each of the scanpoints is provided with scan-out capabilities. Scan-out capabilities are known in the art and generally function as follows. Each of the scanpoints is provided with a scan-out signal line connecting an output of the scanpoint to the service processor 106. In the error determination scan tree 200, this capability is represented by arrows 226, 246, 266 and 277. Each of the scanpoints 225, 245, 265, 276 is also provided with an addressing mechanism and an enable signal line. When the service processor desires to scanpoint a particular scan-out, the address of that scanpoint and an enable signal are provided thereto and the output of the scanpoint is read by the service processor over the appropriate signal line 226, 246, 266, 277.

To determine a state of the system, a necessary task after the occurrence of an error signal causing the system clock to be disabled, the service processor begins an interrogation process to determine which data locations indicated an error. During a first step in this process, the unit scanpoint of each of the units (this is scanpoint 276 for the unit of FIG. 4) is scanned to determine if an error signal was generated from a data location within that unit. In a next step, the chip scanpoints for each of the units which indicated the generation of an error signal are interrogated. And in a final step, the individual EHL which are input to a chip bundling device for a chip which has indicated an error are interrogated.

Using the error determination scan tree 200 as an example, if unit scanpoint 276 indicates an error during the first pass, scanpoints 225, 245 and 265 (and those of the other error history chips not shown in FIG. 4) are interrogated, in a second pass, to determine which of the chips has latched an error. The EHLs for those chip scanpoints which indicate an error are then individually scanned out so that their state is determined. In this manner, a very rapid, focused determination may be had as to the location and extent of erroneous data in the machine. This significantly reduces the amount of time required during period B (above) to determine erroneous data locations and provides the recovery algorithm invoked by the service processor 106 with additional time to recover a state of the machine. The probability that the clocks-off period will exceed the critical window is, thereby, reduced.

To aid the service processor 106 in interrogating and recovering the correct system state, a plurality of counters 285–287 may be provided. These counters 285–287 are enabled to begin a count by a signal propagating from NOR-gates 221, 241 and 261, respectively, to the unit error NOR-gate 290. The counters 285–287 are used to establish a count indicative of the number of clock cycles between the detection of an error and the stopping of the system clock. Counter 286 may be adjusted to begin counting on a count that is adjusted to compensate for the delay introduced by the staging latch 243. Counters of the type shown in FIG. 4 are generally known.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. In a data processing system, including a plurality of data locations, through which data are propagated in system clock cycles in response to a system clock signal, an error determination scan tree apparatus comprising:

a plurality of error detection means, each in communication with an associated data location, for detecting errors in the associated location and for generating an error signal upon detection of an error;

a plurality of error latching means, each associated with an error detection means, where each said error latching means is set by said error signal generated by said associated error detection means;

a plurality of combining means connected in a tree structure to said plurality of error latching means for providing an output signal whenever any one of said plurality of error latching means has been set;

a plurality of scanpoint means each connected to one of said plurality of combining means;

interrupt means for receiving said output signal from said plurality of combining means for disabling the system clock signal in response to said output signal; and interrogation means for systematically interrogating less than all of said plurality of scanpoint means to determine a path through said tree structure of said plurality of combining means to identify a combining means of said plurality of combining means that is directly connected to an error latching means of said plurality of error latching means that has been set wherein the number of said plurality of error latching means that must be scanned is reduced for determining which one of said plurality of error latching means has been set.

2. The apparatus of claim 1, wherein said tree structure of said plurality of combining means further comprises:

a plurality of logic OR means arranged in a multi-tier tree structure such that no more than three tiers separate one of said error latching means and said interrupt means.

3. In a data processing system, including a plurality of data locations, through which data are propagated in system clock cycles in response to a system clock signal, a method for determining a data location responsible for generating an error signal, said method comprising the steps of:

generating an error signal in response to the detection of an error at one of said plurality of data locations;

setting an error latch means associated with the data location at which said error is detected;

propagating said setting of said error latch means through a plurality of combining means, said plurality of combining means being connected in a tree structure, to produce an output signal from said plurality of combining means which is indicative that an error latch means has been set;

conditioning a scanpoint means within said tree structure which is associated with each combining means of said plurality of combining means through which said setting of said error latch means has been propagated;

generating a clock interrupt signal in response to receipt of said output signal to arrest the propagation of data in said system; and performing a hierarchical scan of said scanpoint means to determine which one of said plurality of combining means first propagated the setting of said error latch means wherein the number of error latch means that must be scanned is reduced for determining the data location responsible for generating said error signal.

4. In a data processing system having a plurality of data locations through which data are propagated in system clock cycles in response to a system clock signal, and including a plurality of error latching means for latching generated error signals and a plurality of low level combining means where each low level combining means is associated with a subset of said error latching means and high level combining means where each high level combining means is associated with a subset of said low level combining means, and wherein a generated error signal is propagated from said plurality of error latching means to error servicing means which upon receipt of said error signal generates a system clock stop signal halting the propagation of data in said system, a method for determining a data location which caused an error signal to be generated, said method comprising the steps of:

scanning, in a first scanning step, scanpoint means associated with each of said high level combining means to determine which of said high level combining means is connected to a subset of low level combining means which propagated said error signal;

scanning, in a second scanning step, only those scanpoint means associated with each of said low level combining means identified in said first scanning step to determine which one of said low level combining means propagated said error signal; and scanning, in a third scanning step, only those error latching means connected to said low level combining means identified in said second scanning step to determine which of said error latching means was initially set by said error signal.

* * * * *